United States Patent
Malone, Jr.

(10) Patent No.: US 11,264,945 B2
(45) Date of Patent: Mar. 1, 2022

(54) VERTA SOLAR SUN PANEL

(71) Applicant: James Malone, Jr., South Plainfield, NJ (US)

(72) Inventor: James Malone, Jr., South Plainfield, NJ (US)

( * ) Notice: Subject to any disclaimer, the term of this patent is extended or adjusted under 35 U.S.C. 154(b) by 65 days.

(21) Appl. No.: 16/686,054

(22) Filed: Nov. 15, 2019

(65) Prior Publication Data

US 2020/0162018 A1    May 21, 2020

Related U.S. Application Data

(60) Provisional application No. 62/770,484, filed on Nov. 21, 2018, provisional application No. 62/808,665, filed on Feb. 21, 2019.

(51) Int. Cl.
*H02S 40/22* (2014.01)
*H02S 40/36* (2014.01)
*H01L 31/043* (2014.01)
*H02S 30/00* (2014.01)

(52) U.S. Cl.
CPC ............ *H02S 40/22* (2014.12); *H01L 31/043* (2014.12); *H02S 30/00* (2013.01); *H02S 40/36* (2014.12)

(58) Field of Classification Search
CPC ................. H02S 20/20; H02S 20/22
See application file for complete search history.

(56) References Cited

U.S. PATENT DOCUMENTS

| 5,089,055 A * | 2/1992 | Nakamura ............... G02B 6/32 136/248 |
| 8,456,461 B2 | 6/2013 | Stephens |
| 9,899,556 B2 | 2/2018 | Ma et al. |
| 2014/0158182 A1* | 6/2014 | Watkins .................... H02J 11/00 136/246 |
| 2017/0104426 A1* | 4/2017 | Mills ....................... H02S 40/22 |
| 2020/0006586 A1* | 1/2020 | Bae ................... H01L 31/02327 |

FOREIGN PATENT DOCUMENTS

| KR | 101183089 B1 | 9/2012 |
| WO | 2017148118 A1 | 9/2017 |

* cited by examiner

*Primary Examiner* — Daniel P Malley, Jr.
(74) *Attorney, Agent, or Firm* — Gearhart Law LLC

(57) ABSTRACT

Systems for generating solar power are provided. One such system includes a solar radiation collector and one or more side-emitting fiber-optic cables, coupled to the solar radiation collector. The system further includes one or more photovoltaic cell enclosures, including an outer housing and one or more photovoltaic cells, wherein the one or more side-emitting fiber-optic cables is positioned within the outer housing and configured to emit, to the one or more photovoltaic cells, solar radiation collected from the solar radiation collector.

11 Claims, 21 Drawing Sheets

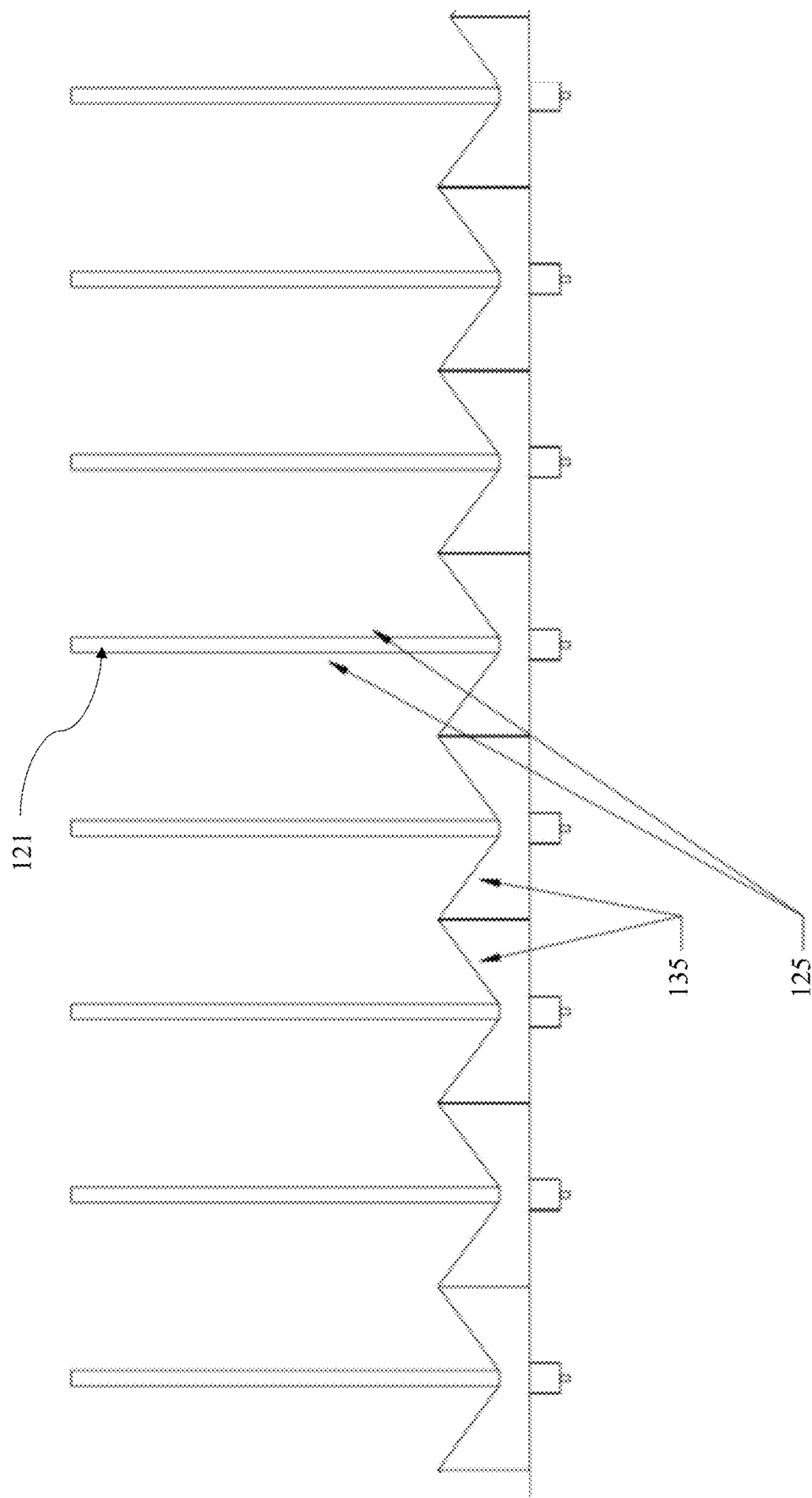

VERTA SOLAR SUN PANEL

CLAIMS OF PRIORITY

This application is a United States Non-Provisional patent application that claims priority to U.S. Provisional Patent Application No. 62/770,484 filed on Nov. 21, 2018 and also claims priority to U.S. Provisional Patent Application No. 62/808,665 filed on Feb. 21, 2019, the contents of which are hereby incorporated by reference in their entirety.

FIELD OF THE EMBODIMENTS

This invention relates to solar power generators and, in particular, to solar power generation systems incorporating fiber-optic light emission components.

BACKGROUND OF THE EMBODIMENTS

Renewable energy is a clean and efficient means of generating electricity. In recent years, the use of renewable energy generators has increased. In many areas, renewable energy generation has become commonplace, either in place of, or in addition to, the use of fossil fuels to generate electricity. This is due to multiple factors, including cheaper manufacturing costs, desires to produce more eco-friendly forms of energy, desires for nations and individuals to become less dependent from fossil fuels, and other similar reasons.

One such source of renewable energy is solar radiation. The typical format for the conversion of solar radiation to electric power includes one or more photovoltaic cells positioned toward the Sun in order to collect the solar radiation. However, facing the photovoltaic cells toward the Sun maximizes the square footage needed to house a singular photovoltaic cell, limiting the energy-generation potential per square foot.

For at least this reason, a new system for generating solar power is needed that decreases the square footage required for the placement of photovoltaic cells.

Examples of related art are described below:

U.S. Pat. No. 9,899,556 generally describes tandem solar cells comprising two or more solar cells connected in a solar cell stack via pn diode tunnel junctions and methods for fabricating the tandem solar cells using epitaxial lift off and transfer printing are provided. The tandem solar cells have improved tunnel junction structures comprising a current tunneling layer integrated between the p and n layers of the pn diode tunnel junction that connects the solar cells.

U.S. Pat. No. 8,456,461 generally describes a method and apparatus for ambient light detection and power control using photovoltaics is disclosed. In an embodiment, a device includes a display and a photovoltaic cell. The photovoltaic cell acts as both an ambient light sensor and a power source. Based on the detected ambient light level, the brightness of the display is increased or decreased to save power, and energy captured by the photovoltaic cell is converted into a useable power signal which is stored or used by device components.

Korean Patent Publication No. KR 101183089 B1 generally describes a solar cell module assembly to assemble and dissemble a solar cell module with a stable structure at an outer wall thereof by installing mullion and transom in a matrix form.

International Patent Publication No. WO 2017/148118 A1 generally describes a photovoltaic charging cellphone case, comprising: a photovoltaic panel group, a maximum power point tracking circuit and a charging circuit. The photovoltaic panel group is configured to convert light energy into electric energy, and the maximum power point tracking circuit is configured to track the maximum power point of the photovoltaic panel group and output the electric energy of the maximum power point to a battery of a device via the charging circuit, wherein the maximum power point tracking circuit is connected to the photovoltaic panel group. The maximum power point tracking circuit is integrated in the photovoltaic charging cellphone case to track the maximum power point of the photovoltaic panel group so as to realize the maximum power output, so that the charging voltage and current can both be matched reasonably, thereby solving the related problem that a photovoltaic design of a cellphone protection case needs to independently carry a control apparatus, and also shortening the charging time, improving the charging efficiency and enhancing the user experience.

None of the art described above addresses all of the issues that the present invention does.

SUMMARY OF THE EMBODIMENTS

According to an embodiment of the present invention, a system for generating solar power is provided. The system includes a solar radiation collector, one or more light-emitting fiber-optic cables, coupled to the solar radiation collector, and one or more photovoltaic cell enclosures, including: an outer housing and one or more photovoltaic cells, wherein the one or more light-emitting fiber-optic cables is positioned within the outer housing and configured to emit, to the one or more photovoltaic cells, solar radiation collected from the solar radiation collector.

It is an object of the present invention to provide the system for generating solar power, wherein the solar radiation collector includes one or more mirrors.

It is an object of the present invention to provide the system for generating solar power, wherein the one or more photovoltaic cell enclosures includes one or more mirrors positioned within the outer housing.

It is an object of the present invention to provide the system for generating solar power, wherein the one or more mirrors are configured to reflect solar radiation toward the one or more photovoltaic cells.

It is an object of the present invention to provide the system for generating solar power, wherein the one or more photovoltaic cells include two photovoltaic cells positioned such that the two photovoltaic cells face each other.

It is an object of the present invention to provide the system for generating solar power, wherein the outer housing encloses the one or more photovoltaic cells on all sides.

It is an object of the present invention to provide the system for generating solar power, wherein the outer housing includes an opening positioned on an upper portion of the outer housing.

It is an object of the present invention to provide the system for generating solar power, wherein the one or more photovoltaic cells are stacked vertically.

It is an object of the present invention to provide the system for generating solar power, wherein the one or more photovoltaic cell enclosures includes a plurality of photovoltaic cell enclosures aligned in series.

It is an object of the present invention to provide the system for generating solar power, wherein the light-emitting fiber-optic cable extends through each photovoltaic cell enclosure in the series.

It is an object of the present invention to provide the system for generating solar power, wherein the light-emitting fiber-optic cable is a side-emitting fiber-optic cable.

It is an object of the present invention to provide the system for generating solar power, wherein the light-emitting fiber-optic cable is an end-emitting fiber-optic cable.

It is an object of the present invention to provide the system for generating solar power, wherein the one or more photovoltaic cells include a plurality of photovoltaic cells, and wherein the one or more side-emitting fiber-optic cables are positioned between the plurality of photovoltaic cells.

According to another aspect of the present invention, a system for generating solar power is provided. The system includes one or more photovoltaic cell enclosures, including: an outer housing having an opening, one or more photovoltaic cells vertically positioned within the outer housing, and one or more mirrors positioned within the outer housing.

It is an object of the present invention to provide the system for generating solar power, wherein the one or more mirrors are configured to reflect solar radiation toward the one or more photovoltaic cells.

It is an object of the present invention to provide the system for generating solar power, wherein the opening is positioned on an upper portion of the outer housing.

It is an object of the present invention to provide the system for generating solar power, wherein the outer housing further includes a second opening.

It is an object of the present invention to provide the system for generating solar power, wherein the second opening is positioned opposite the opening positioned on the upper portion of the outer housing.

It is an object of the present invention to provide the system for generating solar power, wherein the one or more photovoltaic cells include two photovoltaic cells positioned such that the two photovoltaic cells face each other.

BRIEF DESCRIPTION OF THE DRAWINGS

FIG. 2A-2C depict perspective views of a photovoltaic cell enclosure, according to one or more embodiments disclosed herein.

DESCRIPTION OF THE PREFERRED EMBODIMENTS

Figure 1:
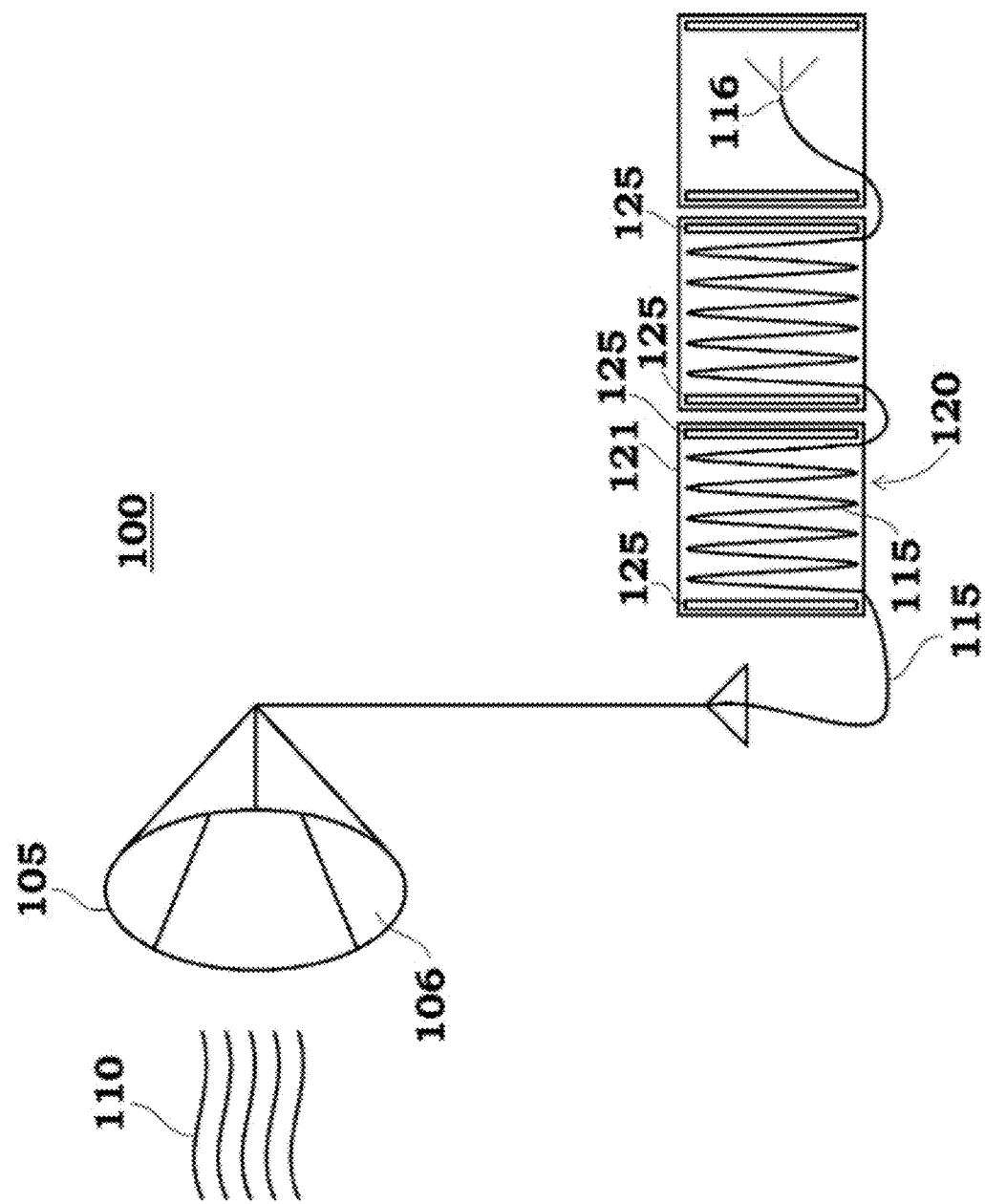
FIG. 1 shows a perspective view of a system for generating solar power, according to one or more embodiments disclosed herein.

The preferred embodiments of the present invention will now be described with reference to the drawings. Identical elements in the various figures are identified with the same reference numerals.

Reference will now be made in detail to each embodiment of the present invention. Such embodiments are provided by way of explanation of the present invention, which is not intended to be limited thereto. In fact, those of ordinary skill in the art may appreciate upon reading the present specification and viewing the present drawings that various modifications and variations can be made thereto.

According to an embodiment and as shown in FIG. 1, a system 100 includes a solar radiation collector 105 configured to collect and concentrate solar radiation 110 from the Sun. According to an embodiment, the system 100 may also include one or more side-emitting fiber-optic cables 115. The one or more side-emitting fiber-optic cables 115 may be coupled to the solar radiation collector 105 and may be configured to receive the concentrated solar radiation 110 that is collected and concentrated from the solar radiation collector 105. According to an embodiment, the solar radiation collector may include one or more mirrors 106.

According to an embodiment, the system 100 may further include one or more photovoltaic cell enclosures 120. It should be appreciated that x-ray views of the photovoltaic cell enclosures 120 are shown in FIG. 1. According to an embodiment, the one or more photovoltaic cell enclosures 120 may include an outer housing 121 and two or more photovoltaic cells 125 housed within the outer housing 121. The two or more photovoltaic cells 125 are positioned such that the solar radiation collecting side of each of the two or more photovoltaic cells 125 are facing a center portion of the photovoltaic cell enclosure 120. According to an embodiment, the two or more photovoltaic cells 125 are facing each other.

According to an embodiment, the one or more side-emitting fiber-optic cables 115 are positioned within the photovoltaic cell enclosures 120 and between the two or more photovoltaic cells 125. The one or more side-emitting fiber-optic cables 115 are configured such that light collected from the solar radiation collector 105 permeates through the sides of the side-emitting fiber-optic cable 115, projecting light onto the solar radiation collecting sides of the two or more photovoltaic cells 125 and causing the two or more photovoltaic cells 125 to generate electricity. It is also noted, however, that end-emitting fiber-optic cables may also be incorporated, while maintaining the spirit of the present invention. According to an embodiment, if end-emitting fiber-optic cables are used, the light-emitting end of the fiber-optic cable is facing the solar radiation side of the one or more photovoltaic cells 125. According to embodiments, the fiber-optic cable may also be or may include a front-emitting fiber-optic cable 116.

Since the light hitting the photovoltaic cells 125 is collected from the solar radiation collector 105, the photovoltaic cell enclosures 120 may be housed indoors, underground, and/or any other location with limited or non-existent access to natural sunlight, while the solar radiation collector 105 remains at a location where it can collect the solar radiation 110.

Figure 2A:
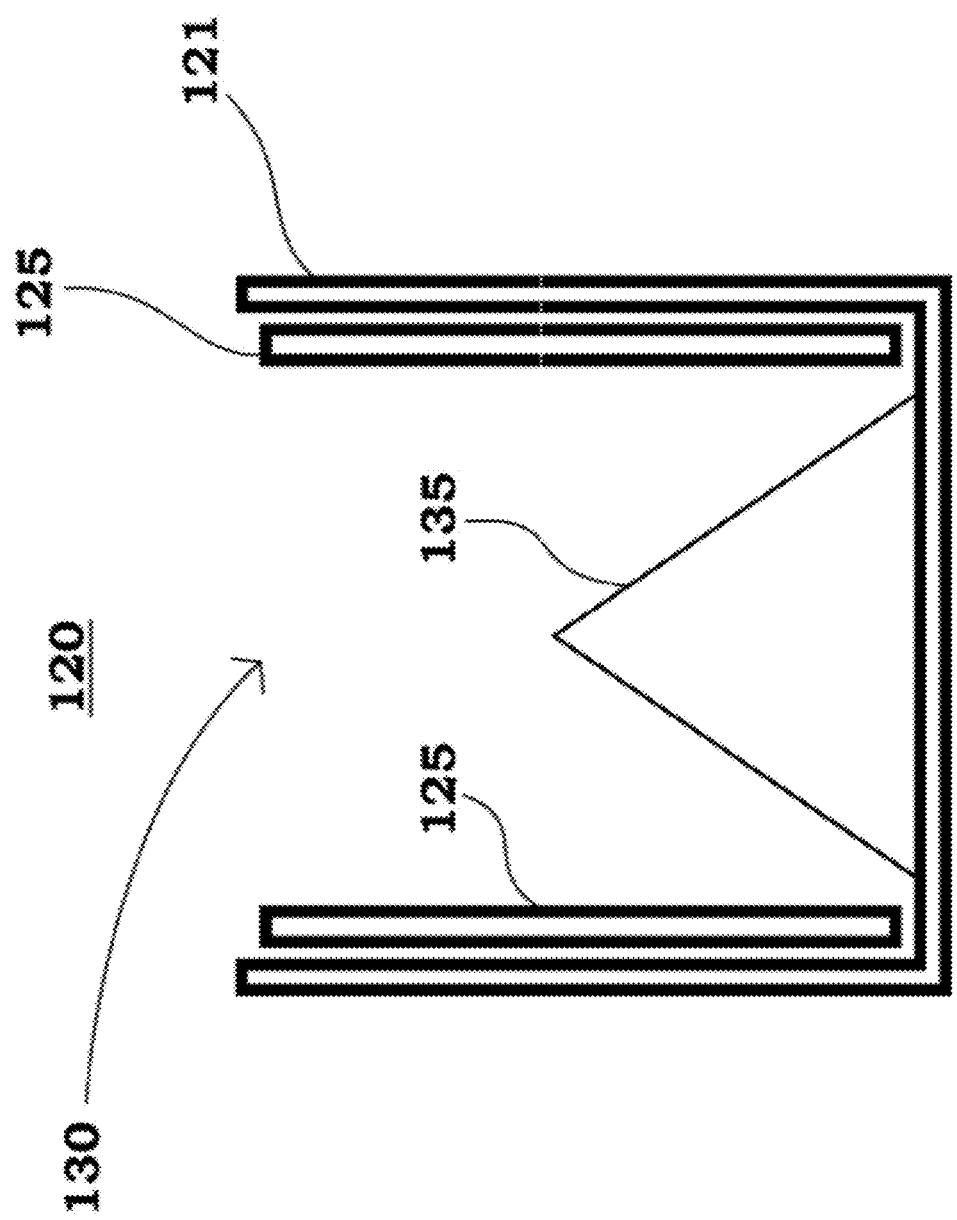
Figure 3:
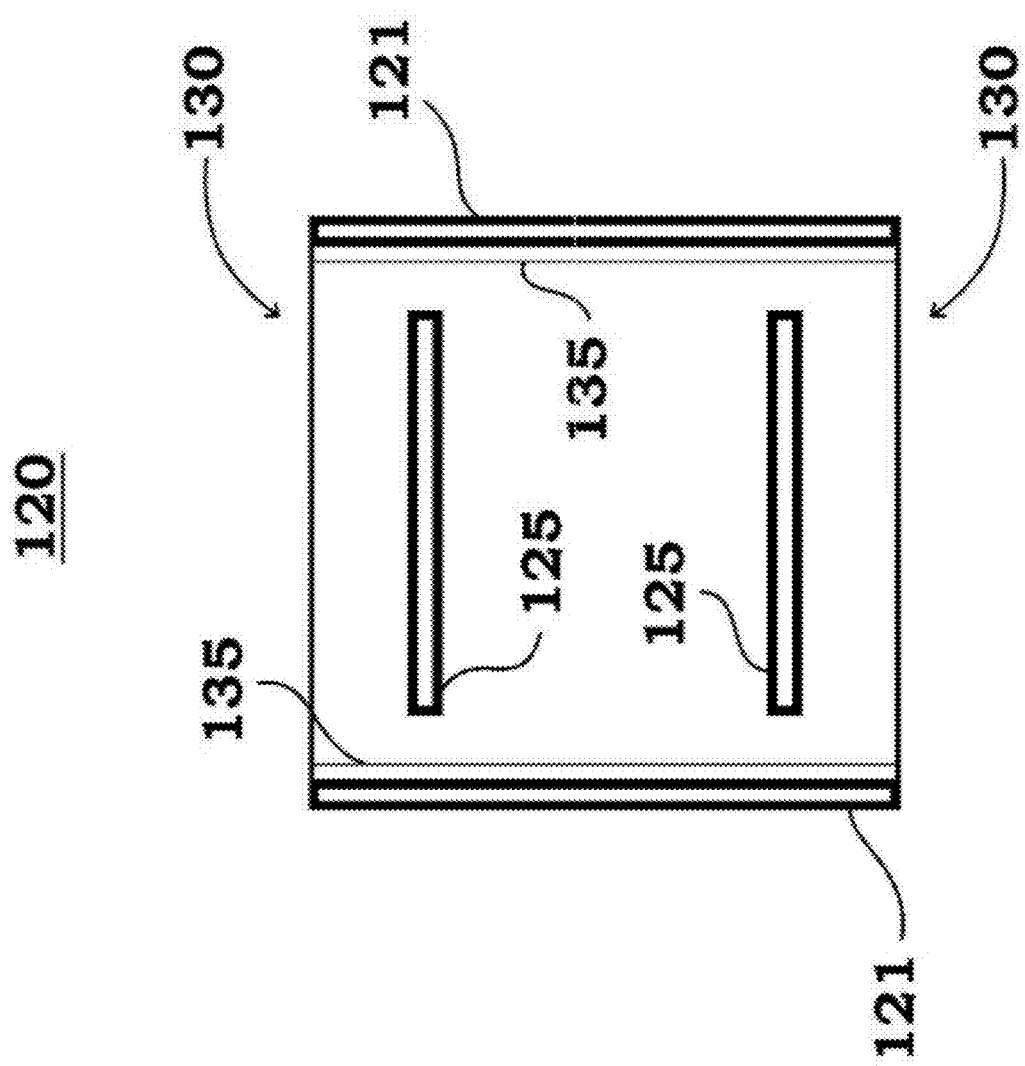
FIG. 3 depicts a perspective view of a photovoltaic cell enclosure having a plurality of openings, according to one or more embodiments disclosed herein.

According to an embodiment, and as depicted in FIG. 2A, the photovoltaic cell enclosure 120 is a fully enclosed structure (as shown in FIG. 1, aside from any opening(s) required for the fiber-optic cable 115 and/or any other components). According to an embodiment, the photovoltaic cell enclosure 120 may have a plurality of openings (as shown in FIG. 3). In some examples, the photovoltaic cell enclosure 120 may include an open top 130, enabling additional solar radiation 110 to permeate through the open top 130 to reach the two or more photovoltaic cells 125.

According to an embodiment, with the open top 130, the photovoltaic cell enclosure 120 may be used with and/or without the fiber-optic cable 115. According to an embodiment, the two or more photovoltaic cells 125 are positioned vertically, decreasing the square footage of the two or more photovoltaic cells 125 in regards to the bottom surface. This enables additional cells of the two or more photovoltaic cells 125 to be positioned per square foot than if the two or more photovoltaic cells 125 were positioned flat against a bottom surface, thereby increasing the potential electrical output of the two or more photovoltaic cells 125 of the present invention as opposed to the two or more photovoltaic cells 125 facing the solar radiation 110, as is the present custom for the placement of photovoltaic cells. This is an improvement upon the existing technologies by enabling more electric power generated per square foot, enabling the owners of property to generate more power than they previously would have using standard solar power generation systems.

Figure 2B:
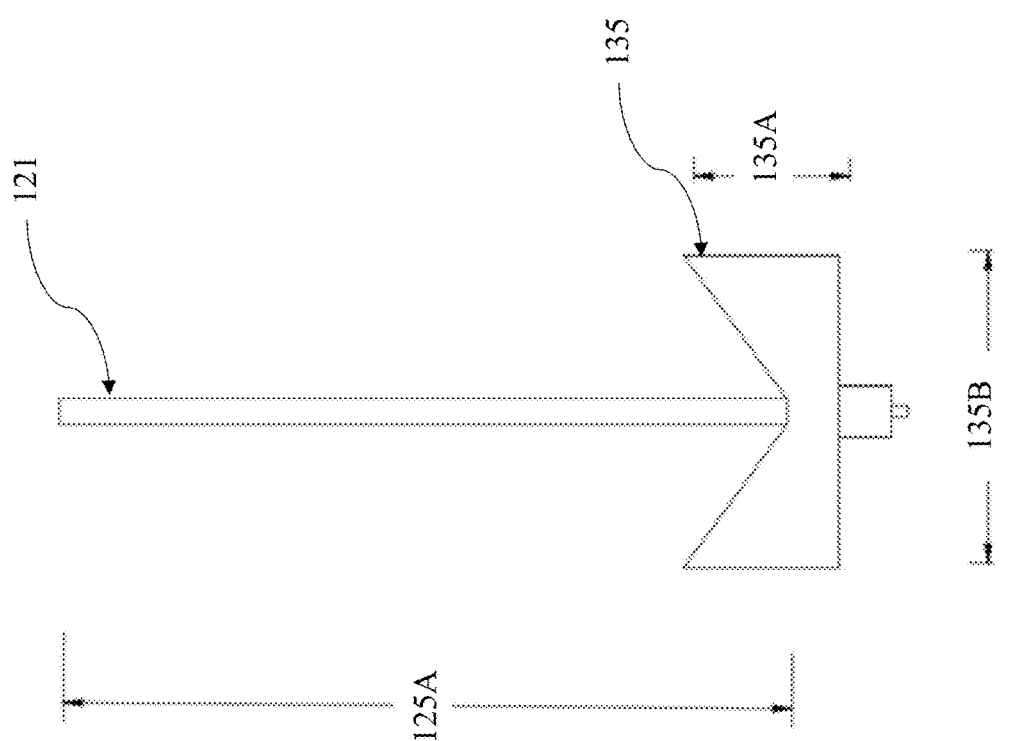

According to an embodiment, the photovoltaic cell enclosure 120 includes one or more mirrors 135 positioned within outer housing 121 of the enclosure 120. According to some examples and as shown in FIG. 2B, the outer housing 121 may have a height 125A of approximately 6.5 inches. Moreover, a height 135A of each of the one or more mirrors 135 may be approximately 1.5 inches. A width 135B of each of the one or more mirrors 135 may be approximately 3 inches. It should be appreciated that the dimensions of the height 125A of the outer housing 121, the height 135A of each of the one or more mirrors 135, and/or the width 135B of each of the one or more mirrors 135 is non-limiting and other dimensions of these components are contemplated.

Further, as shown in FIG. 2C, a cell of the two or more photovoltaic cells 125 may be positioned on each side of the outer housing 121. In some examples, the cell of the two or more photovoltaic cells 125 may be approximately 6 inches in area. However, it should be appreciated that this dimension is non-limiting and other dimensions of the cell of the two or more photovoltaic cells 125 are contemplated.

The one or more mirrors 135 are configured to reflect the solar radiation 110 into the solar radiation collecting sides of the two or more photovoltaic cells 125, enabling the two or more photovoltaic cells 125 to generate more electricity. The one or more mirrors 135 may be flat, triangular, chevron-shaped, and/or any other suitable shape and/or design to effectively reflect the solar radiation 110 onto the solar radiation side of the two or more photovoltaic cells 125.

Figure 4:
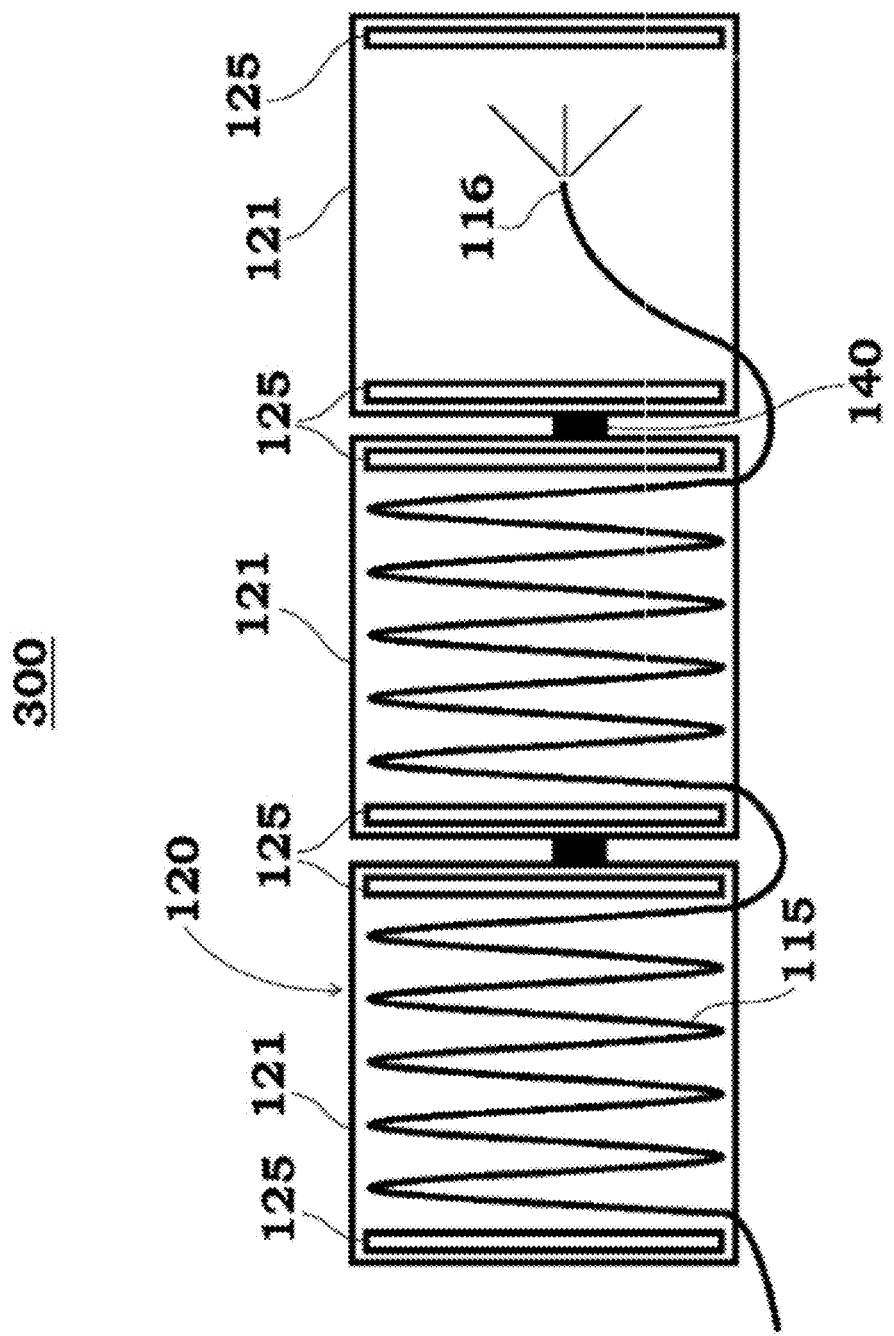
FIG. 4 depicts a perspective views of a series of photovoltaic cell enclosures, according to one or more embodiments disclosed herein.

According to an embodiment, and as shown in FIG. 4, the photovoltaic cell enclosures 120 may be aligned in series 300 to enable the fiber-optic cable 115 to pass from one photovoltaic cell enclosure 120 to the next photovoltaic cell enclosure 120, enabling the light passing through the fiber-optic cable 115 to project the solar radiation 110 onto the two or more photovoltaic cells 125 housed within multiple photovoltaic cell enclosures 120, decreasing the number of fiber-optic cables 115 needed and also decreasing the square footage needed to store the photovoltaic cell enclosures 120. Furthermore, the photovoltaic cell enclosures 120 may further be stacked to further decrease the square footage needed. According to an embodiment, the photovoltaic cell enclosures 120 are secured to each other via one or more securement devices 140.

Figure 5A:
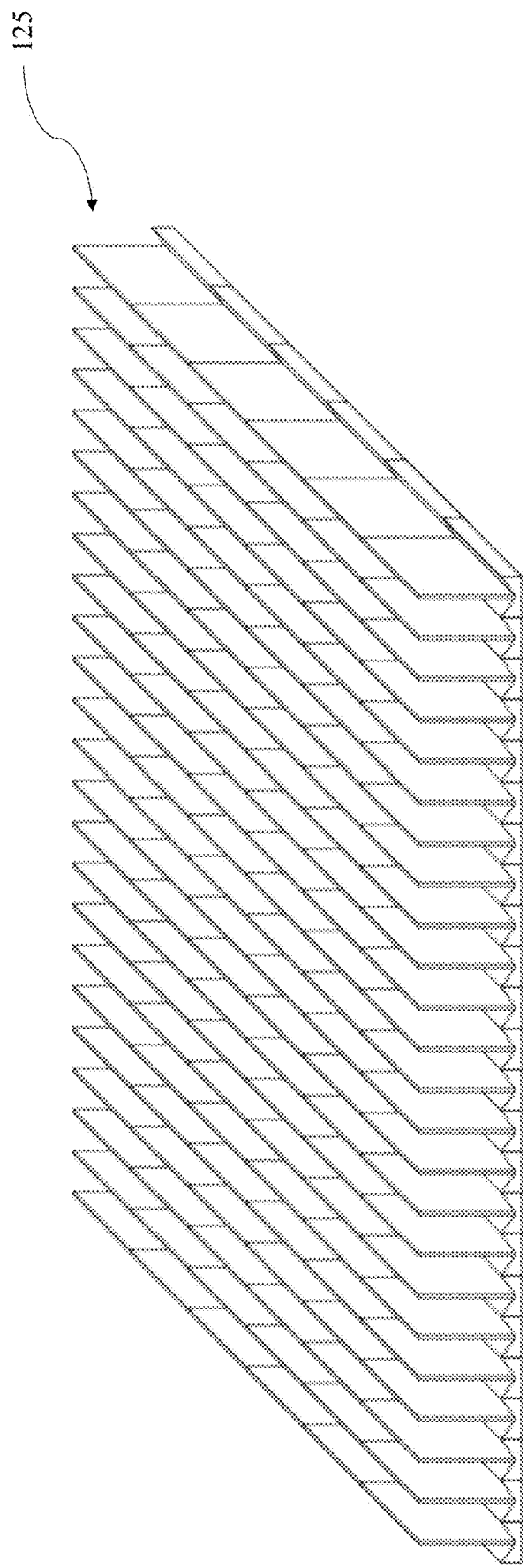
FIG. 5A-5B depict a perspective view of a photovoltaic cell panel, according to one or more embodiments disclosed herein.
Figure 5B:
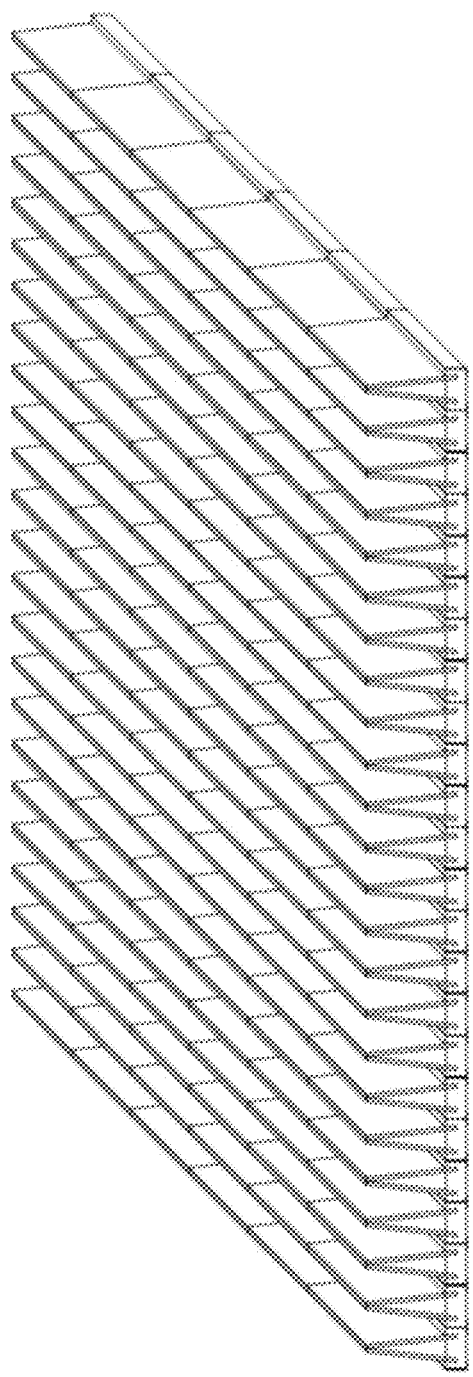

As shown in FIG. 5A and FIG. 5B, the photovoltaic cell panel may comprise the two or more photovoltaic cells 125. In some examples, each cell of the two or more photovoltaic cells 125 may produce approximately 4 watts of electricity. As an illustrative example, the photovoltaic cell panel may be an approximately 7 inch panel comprising 288 total cells. It should be appreciated that other dimensions of the photovoltaic cell panel and/or other quantities of the two or more photovoltaic cells 125 are contemplated.

Figure 6A:
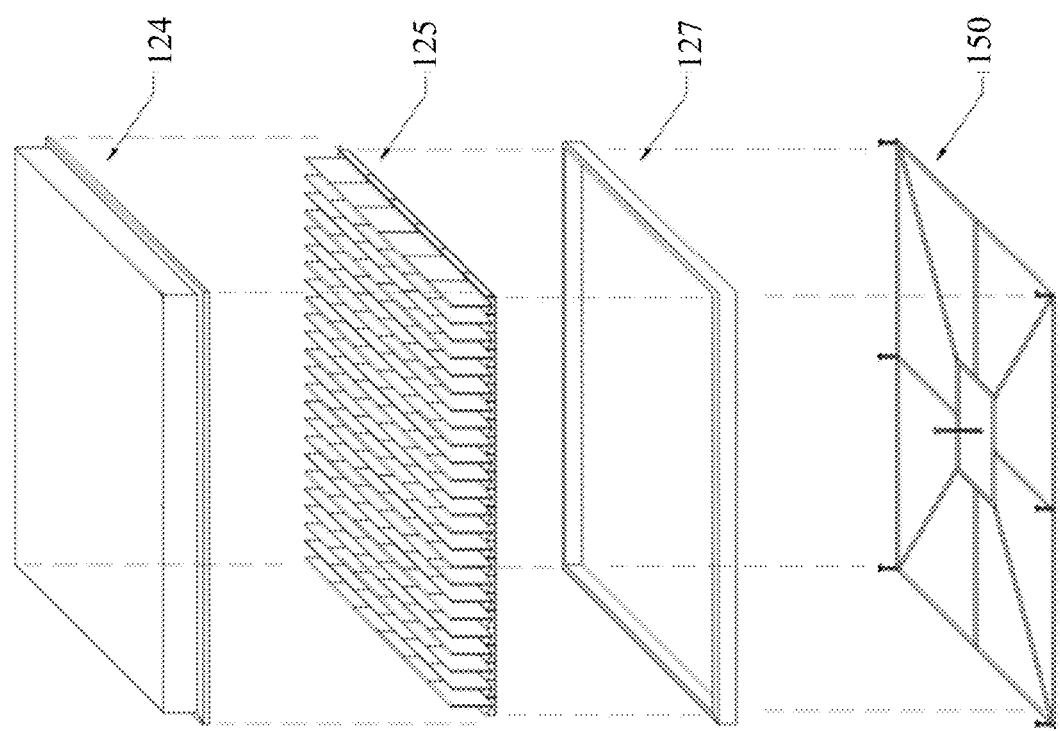
FIG. 6A depicts an exploded view of a photovoltaic cell panel assembly, according to one or more embodiments disclosed herein.
Figure 6B:
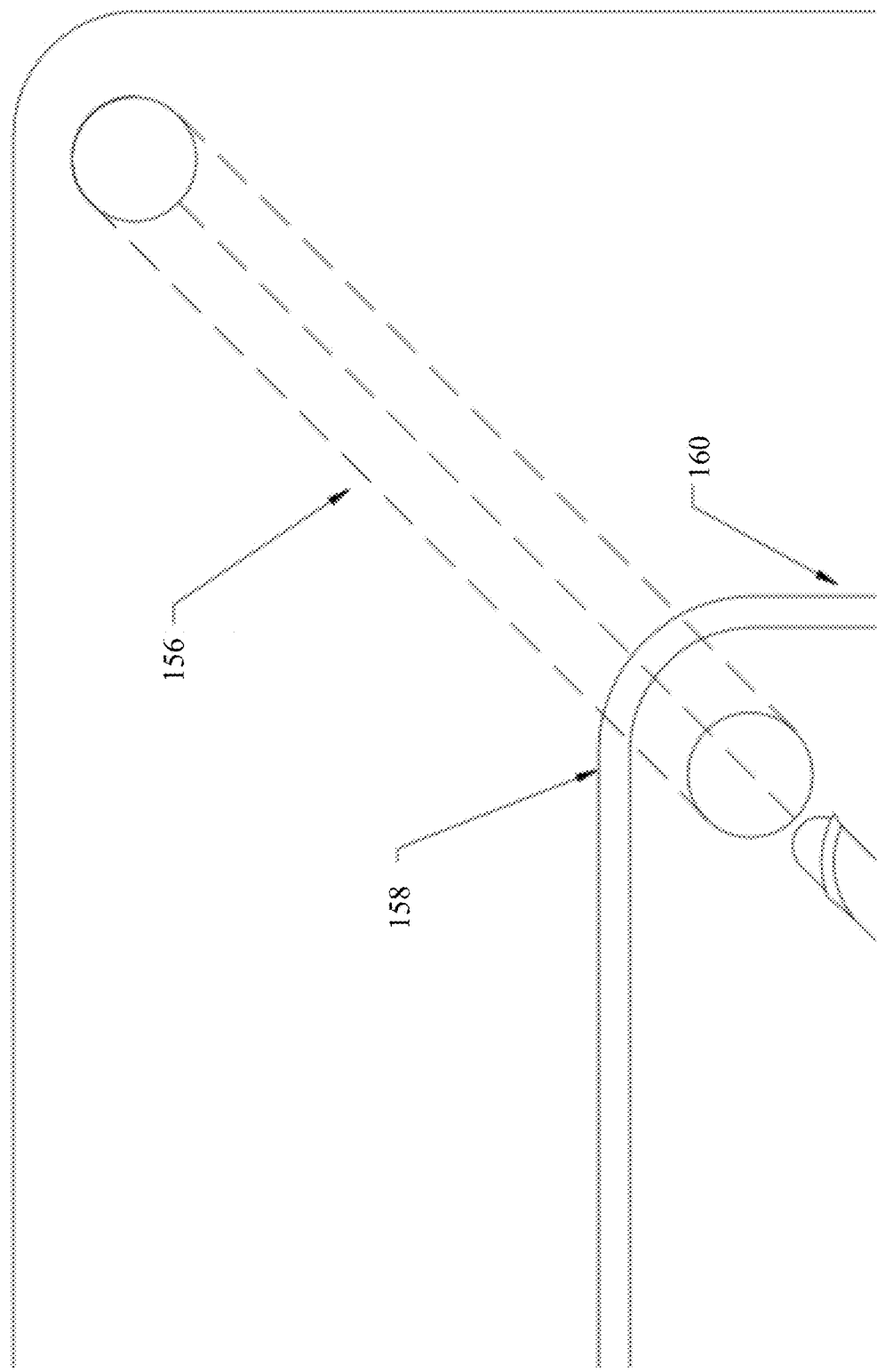
FIG. 6B-6C depict perspective views of a cover of a photovoltaic cell panel assembly, according to one or more embodiments disclosed herein.

As shown in FIG. 6A, the photovoltaic cell panel assembly may comprise numerous components, including: a cover 124, the photovoltaic cell panel (as shown in FIG. 5A and FIG. 5B) that comprises the two or more photovoltaic cells 125, a photovoltaic cell panel holder 127, and a frame 150. As depicted and described in reference to FIG. 6B and FIG. 6C, the cover 124 and/or the frame 150 of the photovoltaic cell panel assembly may have one or more elements that are configured to attach or affix the cover 124 to the frame 150. As an illustrative example and as shown in FIG. 6B, the cover 124 may include one or more support tubes 156 built into the cover 124 for support. In examples, the one or more support tubes 156 may be round or substantially round and may be approximately ¾ of an inch in area. Further, the cover 124 may also include a lip 158 around the outside periphery of the cover 124 that is configured to snap the cover 124 onto the photovoltaic cell holder 127. Moreover, in some examples, a gasket 160 may be located between the cover 124 and the photovoltaic cell holder 127 to form a seal to prevent air and/or moisture from entering the assembly. It should be appreciated that the dimensions of the various components described herein are non-limiting and other dimensions are contemplated.

Figure 6C:
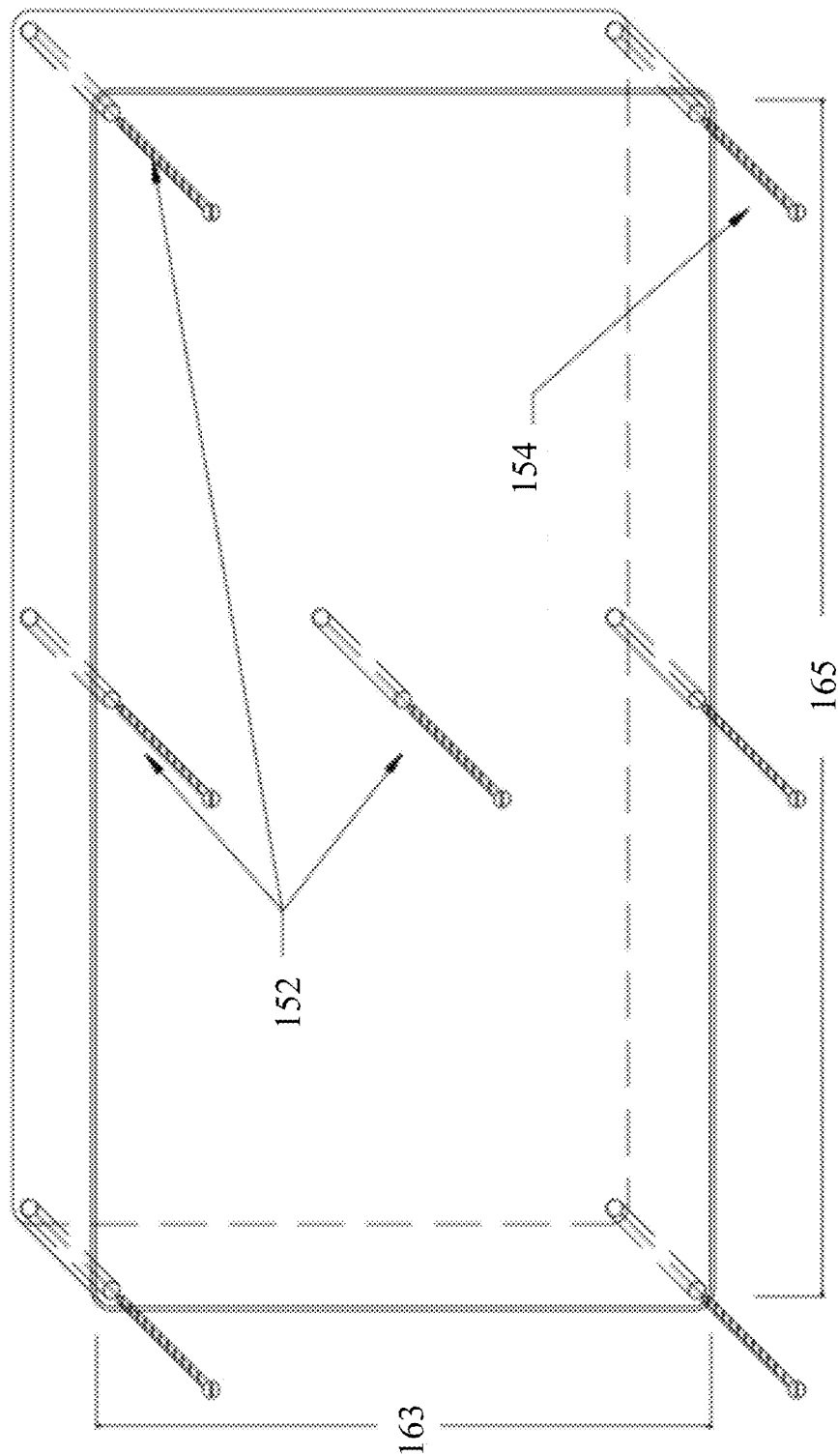

Moreover, as shown in FIG. 6C, the cover 124 may include one or more components 152 configured to receive one or more screws or bolts 154 to affix the cover 124 to the frame 150. Moreover, it should be appreciated that the photovoltaic cell holder 127 and the two or more photovoltaic cells 125 may be included as components between the frame 150 and the cover 124 to form the photovoltaic cell panel assembly. According to some examples, the one or more screws or bolts 154 may be 7¼ inch screws or bolts. It should be appreciated that the one or more screws or bolts 154 may be of other sizes and/or shapes. In additional examples, the photovoltaic cell panel assembly may be approximately 73 inches in length 165 and 37 inches in height 163. It should be appreciated that the photovoltaic cell panel assembly may be of other dimensions not explicitly listed herein.

According to some examples, the cover 124 may comprise a plastic material. In additional examples, the cover 124 may comprise a clear plastic material. In other examples, the cover 124 may comprise a 10% glass filled polycarbonate plastic material. Moreover, according to other examples, the frame 150 may comprise a plastic material. In additional examples, the frame 150 may comprise a glass reinforced nylon plastic material. It should be appreciated that the materials comprising the cover 124 and/or the frame 150 are not limited to those described explicitly herein. In further examples, the cover 125 may be set on a five inch pitch radiating out from a center of the cover 124 to account for water runoff.

Figure 6D:
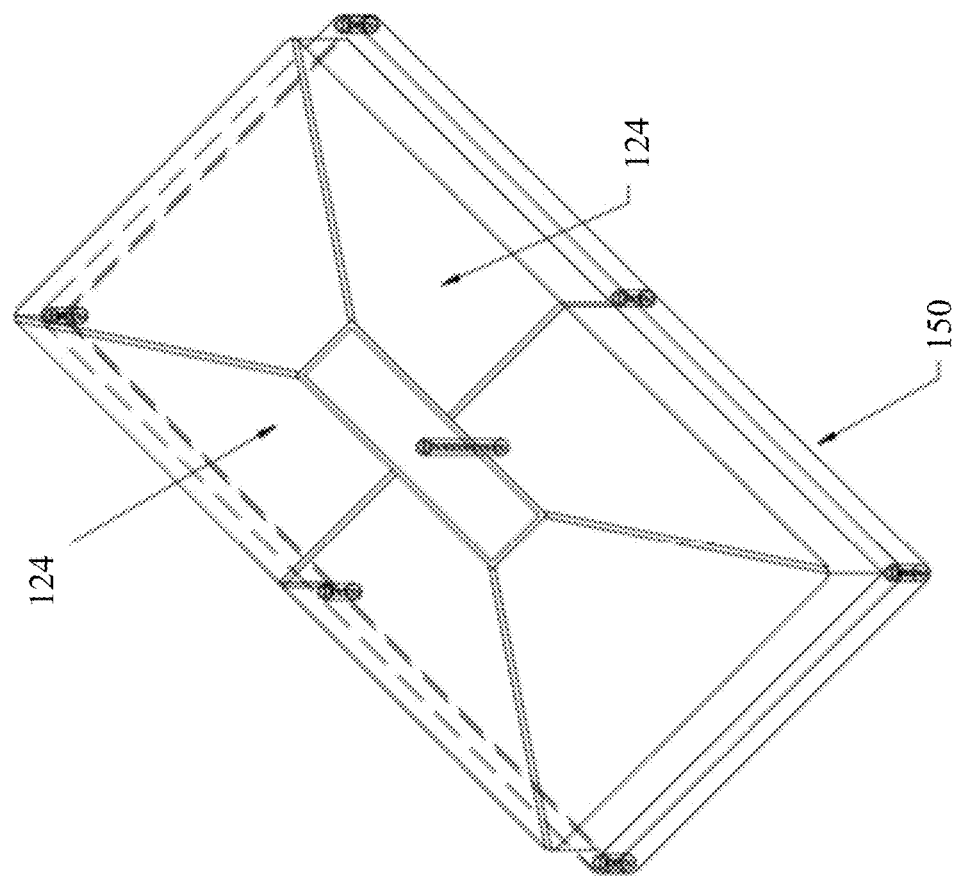
FIG. 6D-6E depict perspective views of a photovoltaic cell panel assembly, according to one or more embodiments disclosed herein.
Figure 6E:
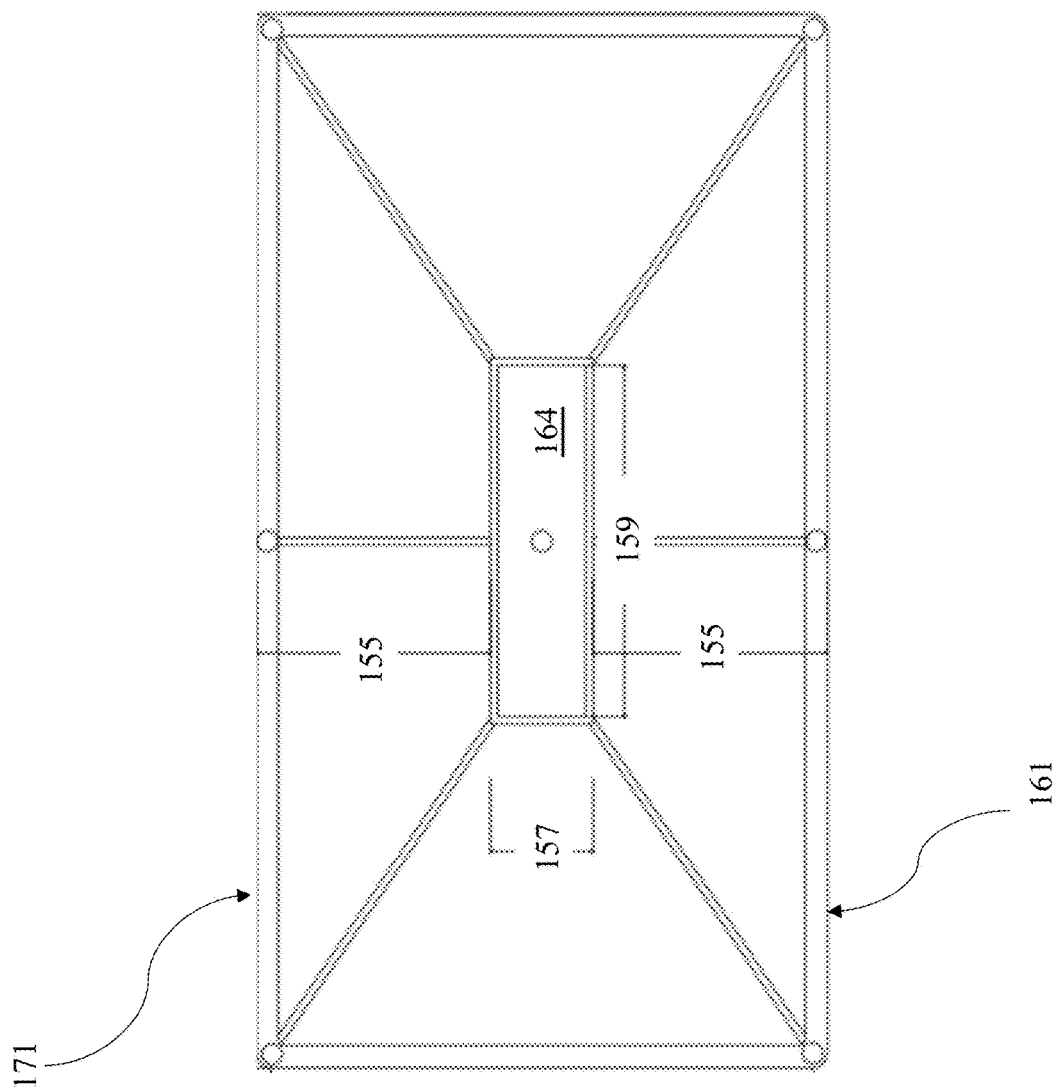

According to some examples and in reference to FIG. 6D and FIG. 6E, the photovoltaic cell panel assembly may house approximately 12 cells of the two or more photovoltaic cells 125 such that the cells face outward. The photovoltaic cell panel assembly may be rectangular in shape and may include a component 164 located in a center of the frame 150 or substantially in the center of the frame 150, such that the component 164 is located at a location 155 that is approximately 15.5 inches from a first side 171 and is approximately 15.5 inches from a second side 161, where the first side 171 of the photovoltaic cell panel assembly is located opposite the second side 161 of the photovoltaic cell panel assembly. In some examples, the component 164 may be approximately 18 inches in length 159 and 8 inches in height 157. According to other examples, the photovoltaic cell panel assembly may be approximately 64 inches in length and 36 inches in height. In another example, the photovoltaic cell panel assembly may be approximately 73 inches in length and 37 inches in height. It should be appreciated that the dimensions of the photovoltaic cell panel assembly described herein are non-limiting and other dimensions are contemplated.

Figure 7:
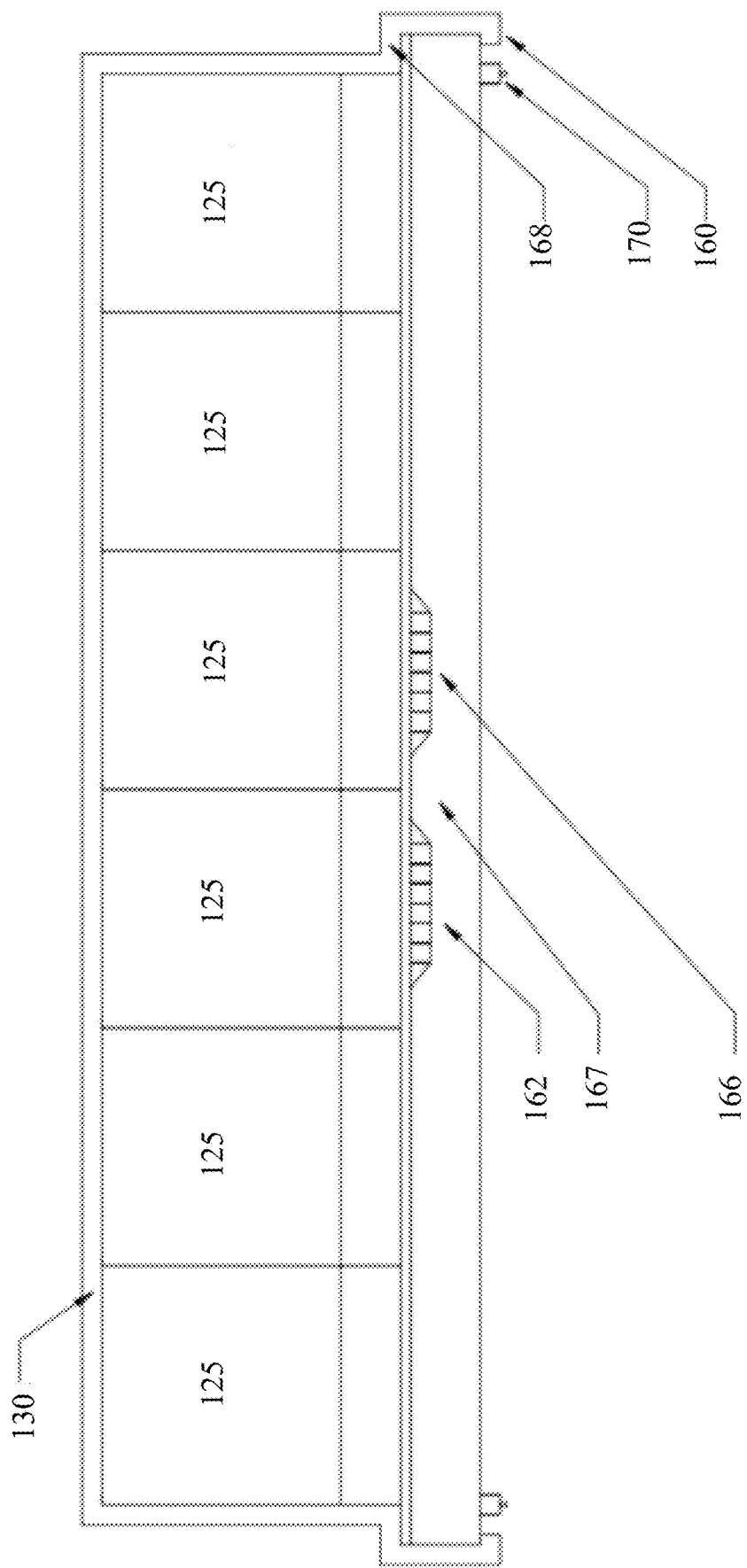
FIG. 7 depicts another perspective view of a photovoltaic cell assembly, according to one or more embodiments disclosed herein.

In another example and as depicted in FIG. 7, the photovoltaic cell assembly may include a cover 124 and may housing the two or more photovoltaic cells 125. The photovoltaic cell assembly may include one or more tabs 167 centered or substantially centered in each row to supply power from each cell of the two or more photovoltaic cells 125. Moreover, the one or more tabs 167 may be located between a positive tab 162 and a negative tab 166. The photovoltaic cell assembly may also include a tab 168 to secure the cover to the photovoltaic cell assembly or remove the cover 124 from the photovoltaic cell assembly. Further, the photovoltaic cell assembly may include an RCA jack 170 and/or the gasket 160 (as described in FIG. 6B). It should be appreciated that connection on both ends of the photovoltaic cell assembly makes it easier to control the two or more photovoltaic cells 125.

Figure 8:
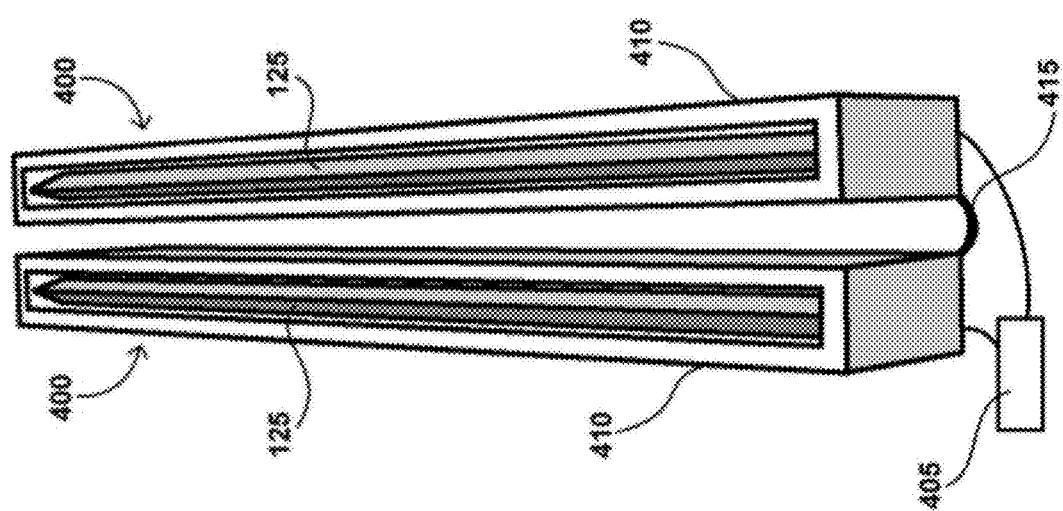
FIG. 8 depicts a perspective view of a series of modular photovoltaic cell units, according to one or more embodiments disclosed herein.
Figure 11:
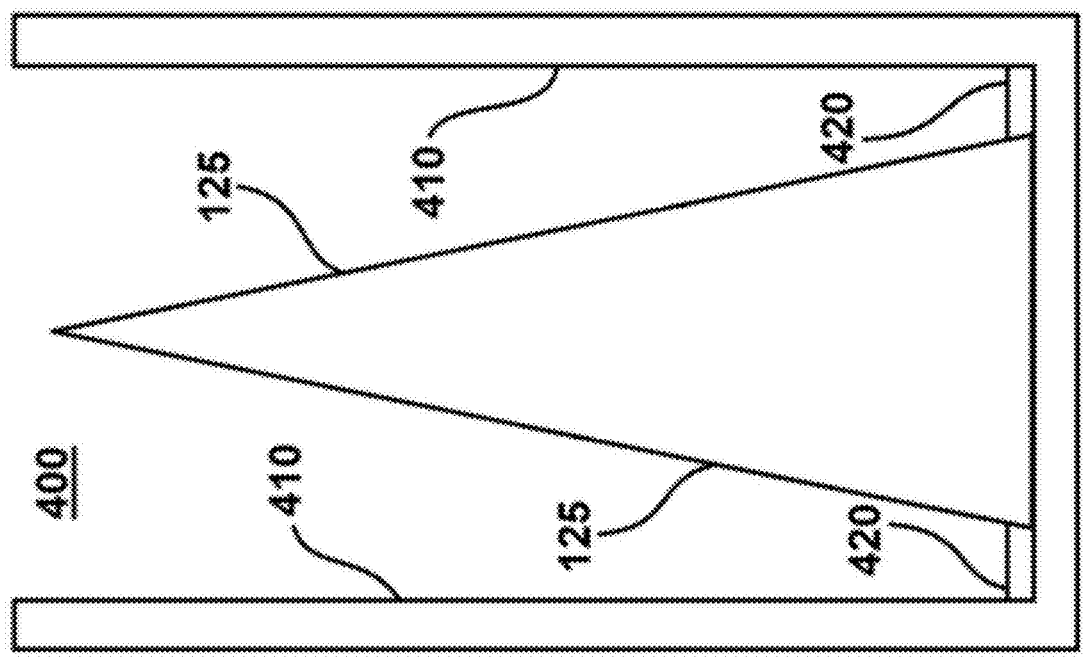
FIG. 11 depicts a cross-sectional view of a modular photovoltaic cell unit, according to one or more embodiments disclosed herein.

As shown in FIG. 8, a series of modular photovoltaic cell units 400 is illustratively depicted. According to an embodiment, the photovoltaic cell enclosures are modular in design (modular photovoltaic cell units), enabling the two or more photovoltaic cells 125 to be replaced at a time. According to an embodiment, the modular series of the two or more photovoltaic cells 125 facilitate control of energy flow with sunlight is low. This further facilitates system diagnostics and simplifies repairs since the two or more photovoltaic cells 125 may be worked on at a time. According to an embodiment, the modular photovoltaic cell units 400 are connected via a wire 415 and/or any other suitable connector. According to an embodiment, the two or more photovoltaic cells 125 are located within an outer housing 410. A cross-sectional view of the modular photovoltaic cell units 400 is shown in FIG. 11. According to an embodiment, one or more surfaces within the housing 410 may include one or more mirrors 420 configured to reflect light towards the two or more photovoltaic cells 125.

According to an embodiment, the modular photovoltaic cell units 400 include a series of the two or more photovoltaic cells 125. However, it is noted that the modular photovoltaic cell units 400 may include any suitable number of the two or more photovoltaic cells 125, while maintaining the spirit of the present invention.

According to an embodiment, the modular photovoltaic cell units 400 may be connected in series. For example, if nine units of the modular photovoltaic cell units 400 are connected in series, and each unit of the modular photovoltaic cell units 400 includes 12 cells of the two or more photovoltaic cells 125, the system of modular photovoltaic cell units 400 would include 108 cells of the two or more photovoltaic cells 125. It is noted, however, that any suitable number of the modular photovoltaic cell units 400 may be connected in series, while maintaining the spirit of the present invention.

Figure 9B:
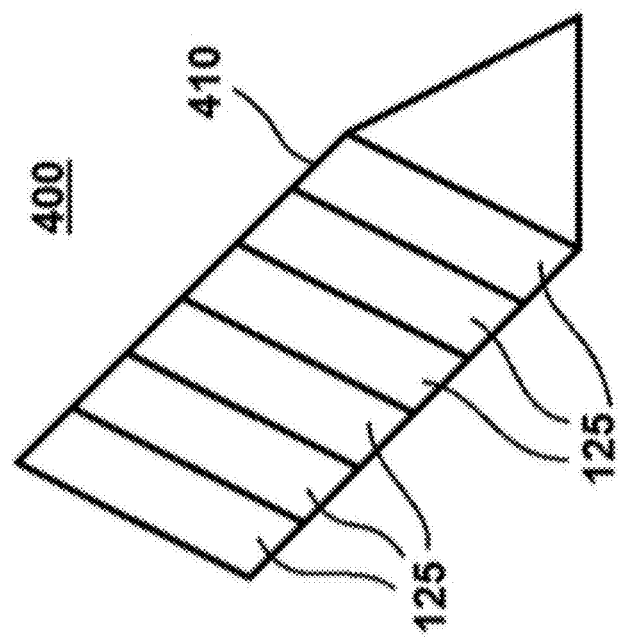
FIG. 9B depicts a right perspective view of a modular photovoltaic cell unit, according to one or more embodiments disclosed herein.
Figure 9A:
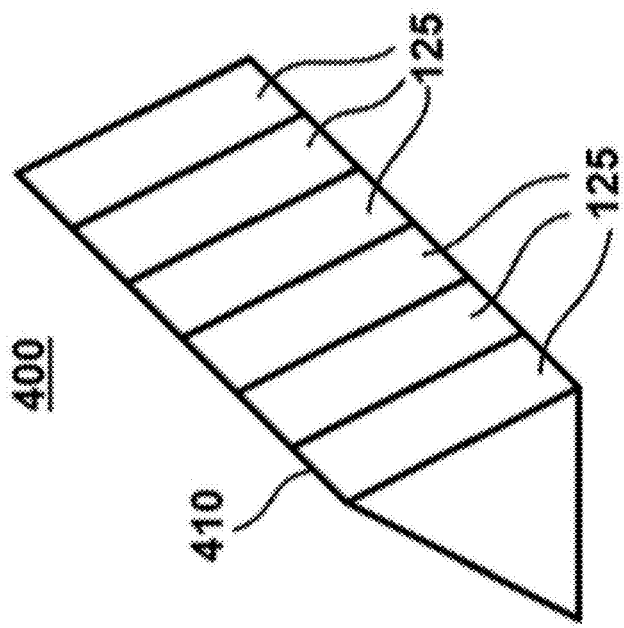
FIG. 9A depicts a left perspective view of a modular photovoltaic cell unit, according to one or more embodiments disclosed herein.

According to an embodiment, the two or more photovoltaic cells 125 may housed in a transparent enclosure 410 (as depicted in FIG. 9A and FIG. 9B), with all cells of the two or more photovoltaic cells 125 facing outward. The transparent enclosure 410 may include a material, such as plastic, glass, and/or any other suitable transparent material. According to an embodiment, and as depicted in FIG. 9A and FIG. 9B, each of the modular photovoltaic cell units 400 may be triangular in shape, enabling the two or more photovoltaic cells 125 to be positioned on two of the triangular shape's sides (as shown in FIG. 9A and FIG. 9B). It is noted, however, that the modular photovoltaic cell units 400 may be of any suitable shape, while maintaining the spirit of the present invention.

Figure 10:
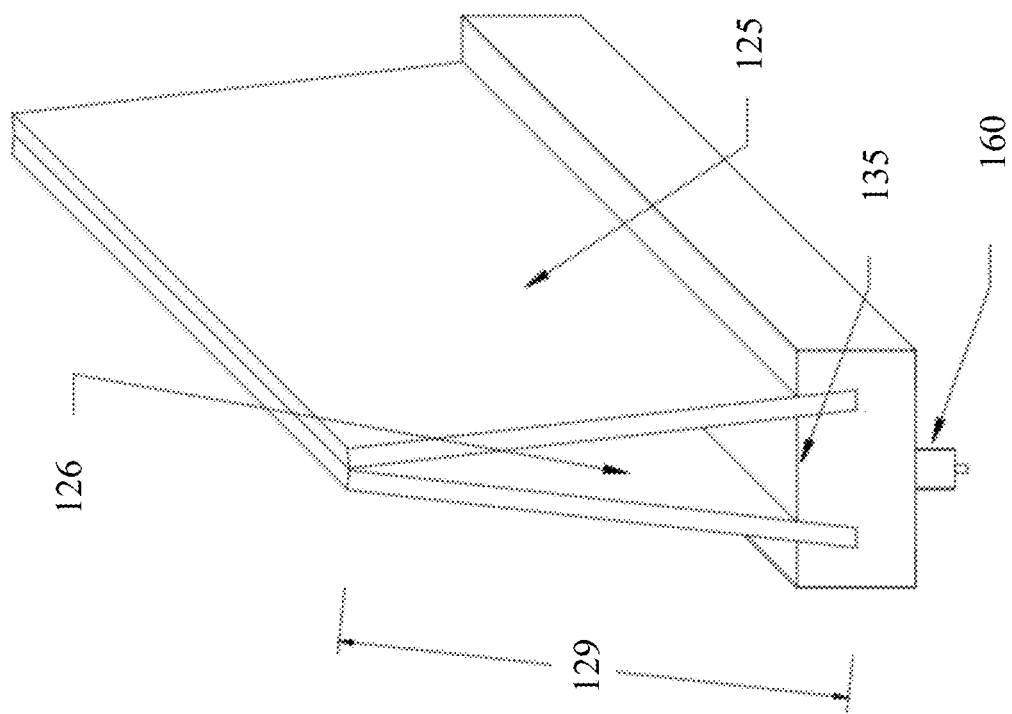
FIG. 10 depicts a perspective view of a modular photovoltaic cell unit, according to one or more embodiments disclosed herein.
Figure 12:
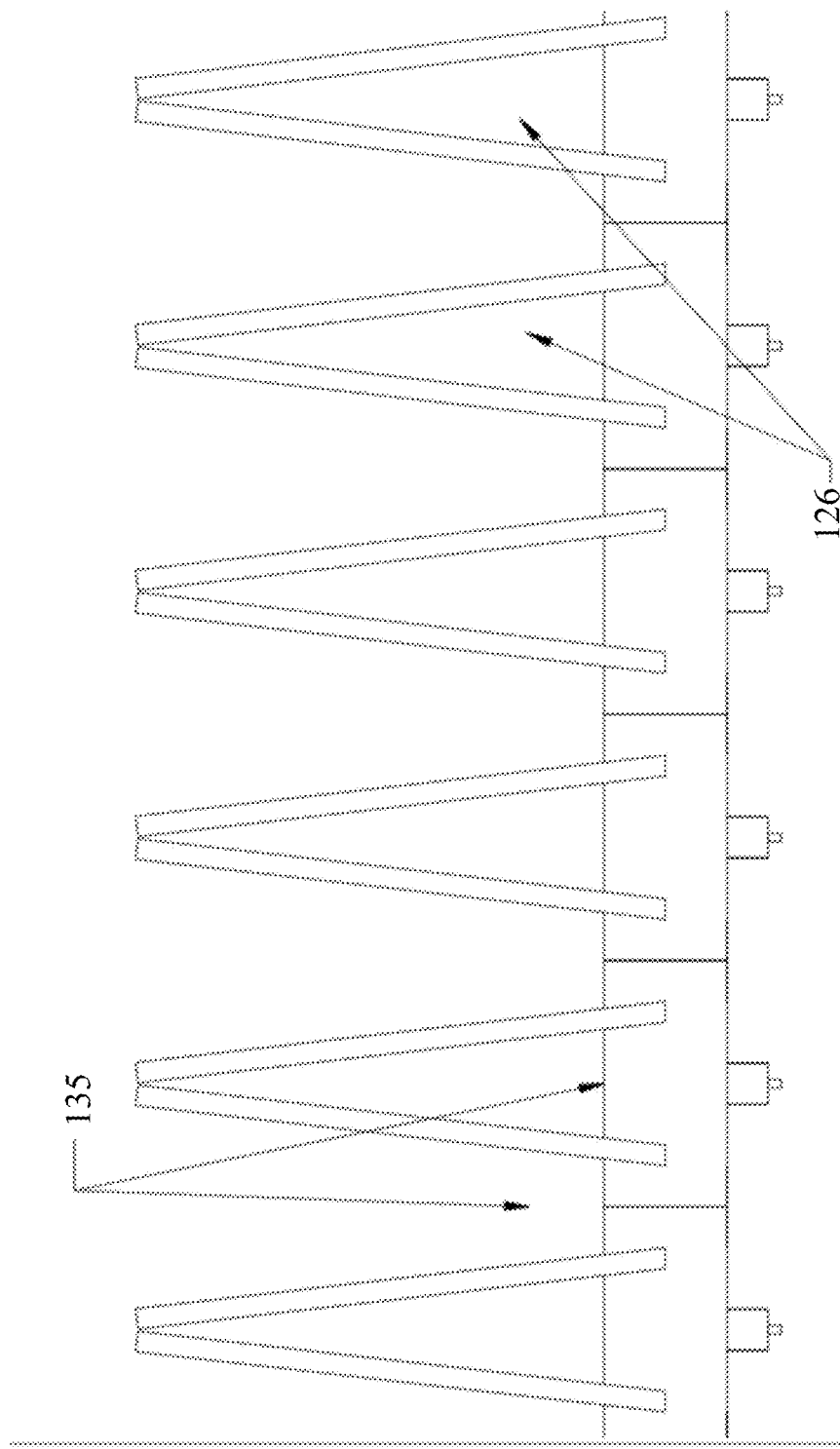
FIG. 12 depicts another perspective view of a modular photovoltaic cell unit, according to one or more embodiments disclosed herein.

As shown in FIG. 10 and FIG. 12, one or more cells of the two or more photovoltaic cells 125 may be housed in a spacing 126 to increase an energy output. In this configuration, the two or more photovoltaic cells 125 may be positioned in a triangular configuration, with a height 129 of each of the two or more photovoltaic cells 125 being approximately 6.5 inches.

Figure 13:
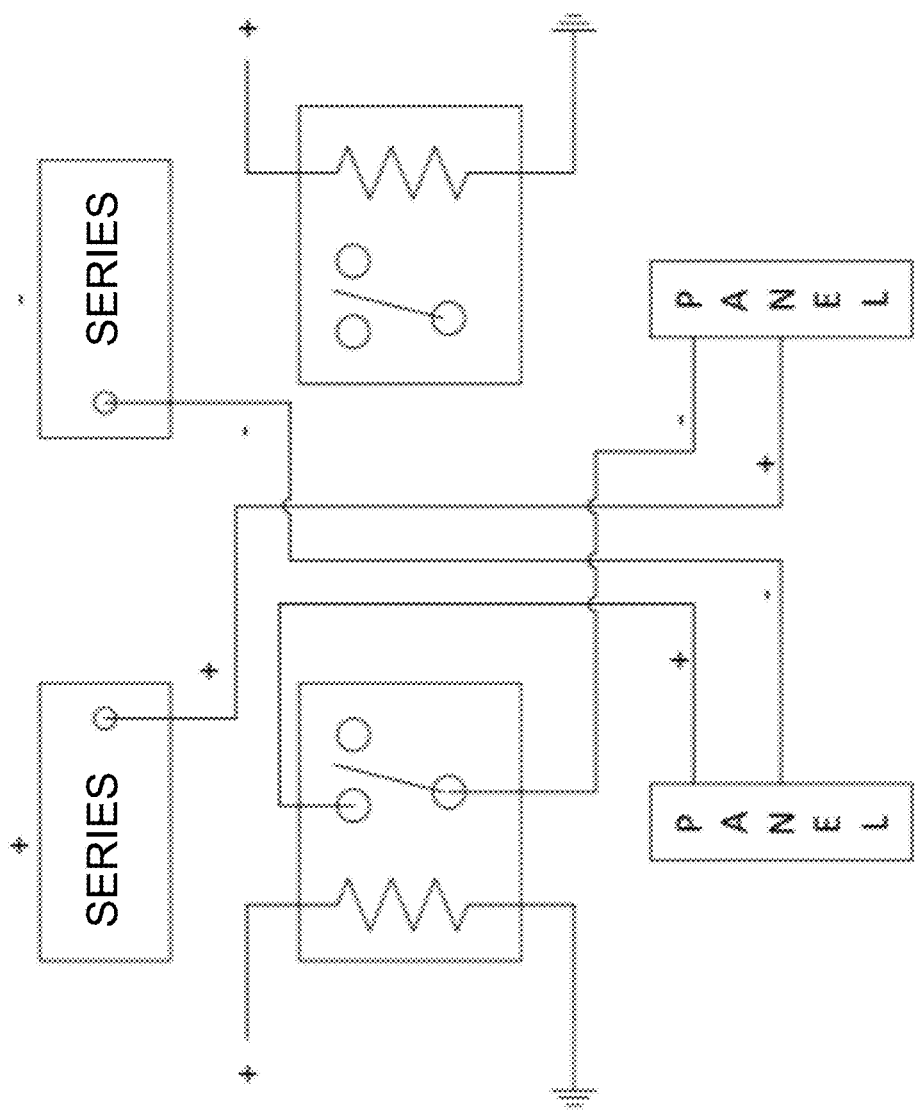
FIG. 13 depicts an electrical schematic of photovoltaic cells in a modular photovoltaic cell unit working in series, according to one or more embodiments disclosed herein.
Figure 14:
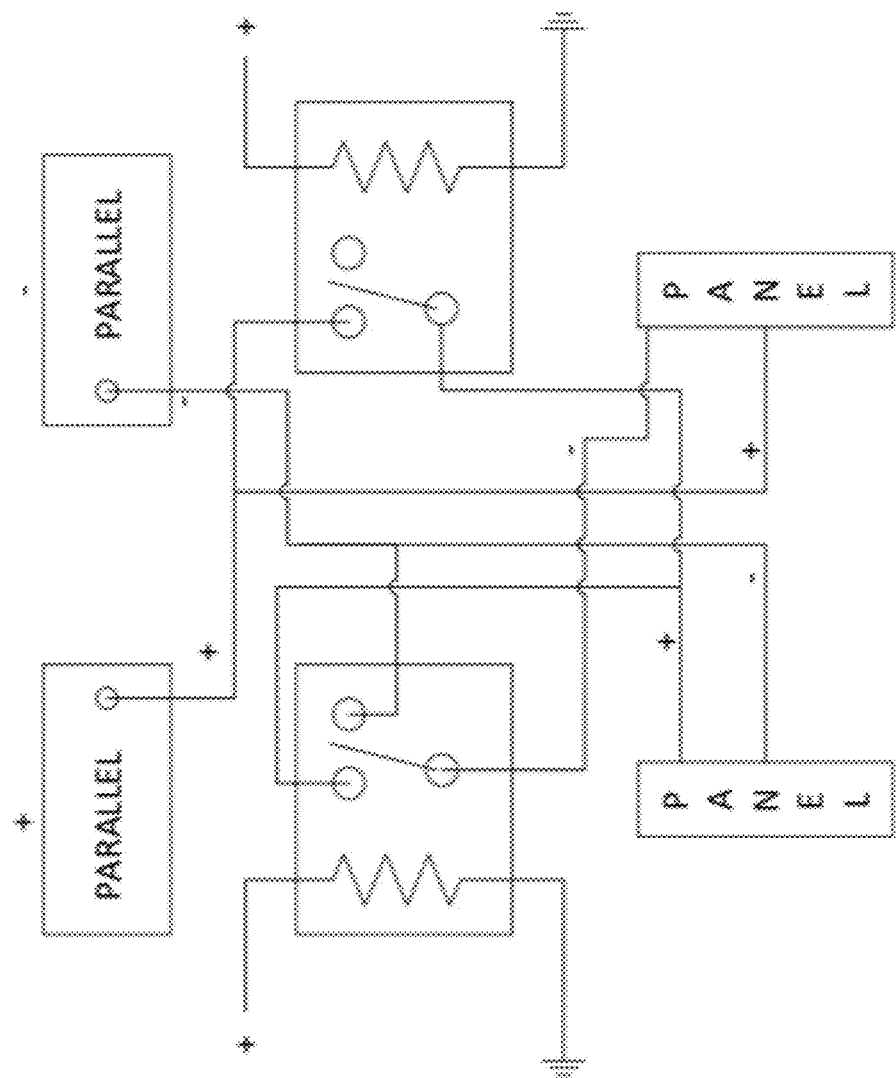
FIG. 14 depicts an electrical schematic of photovoltaic cells in a modular photovoltaic cell unit working in parallel, according to one or more embodiments disclosed herein.

According to an embodiment, an electronic module control 405 (as shown in FIG. 8) may be used to control each unit of the modular photovoltaic cell units 400 in a system, enabling the modular photovoltaic cell units 400 to more efficiently produce energy as sunlight decreases during the day. According to an embodiment, the electronic module control 405 is configured to alter the modular photovoltaic cell units 400 to work in series as needed (as shown in FIG. 13) and to work in parallel as needed (as shown in FIG. 14), depending on the needs of the system and the level of light shining onto the system. Moreover, the electronic module control 405 acts as a module shutdown to remove/disengage current.

When introducing elements of the present disclosure or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

Although this invention has been described with a certain degree of particularity, it is to be understood that the present disclosure has been made only by way of illustration and that numerous changes in the details of construction and arrangement of parts may be resorted to without departing from the spirit and the scope of the invention.

What is claimed is:

1. A system for generating solar power, comprising:
a solar radiation collector located in an area having access to natural solar radiation, wherein the solar radiation collector comprises a first set of mirrors;
one or more side-emitting fiber-optic cables coupled to the solar radiation collector and configured to receive the natural solar radiation from the solar radiation collector; and
one or more photovoltaic cell enclosures housed in an area having no access to the natural solar radiation, wherein each of the one or more photovoltaic cell enclosures are fully enclosed structures that include:
an outer housing;
two or more photovoltaic cells located within the outer housing,
wherein the two or more photovoltaic cells are positioned vertically and facing each other,
wherein the one or more side-emitting fiber-optic cables are positioned within the outer housing and between the two or more photovoltaic cells, and
wherein the one or more side-emitting fiber-optic cables are configured such that the natural solar radiation permeates through a side of the one or more side-emitting fiber-optic cables and projects light onto a solar radiation collecting side of the two or more photovoltaic cells to cause the two or more photovoltaic cells to generate electricity; and
a second set of mirrors located within the outer housing and between the two or more photovoltaic cells, wherein the second set of mirrors are configured to reflect the natural solar radiation onto the solar radiation collecting side of the two or more photovoltaic cells to generate additional electricity;
wherein the system for generating solar power comprises at least one of the following dimensions: a height of the outer housing is approximately 6.5 inches, a height of each mirror of the second set of mirrors is approximately 1.5 inches, and a width of each mirror of the second set of mirrors is approximately 3 inches.

2. The system as recited in claim 1, wherein the one or more photovoltaic cell enclosures includes a plurality of photovoltaic cell enclosures aligned in series based on a power output required.

3. The system as recited in claim 2, wherein the side-emitting fiber-optic cable extends through each photovoltaic cell enclosure in the series.

4. The system as recited in claim 1, further comprising: an end-emitting fiber-optic cable.

5. The system as recited in claim 1, wherein the two or more photovoltaic cells are connected in series.

6. The system of claim 1, wherein each of the second set of mirrors comprise a shape selected from the group consisting of: a flat shape, a triangular shape, and a chevron shape.

7. The system of claim 1, wherein each of the one or more photovoltaic cell enclosures are stacked to decrease a square footage of the system.

8. The system of claim 7, further comprising:
one or more securement devices configured to secure the one or more photovoltaic cell enclosures.

9. A system for generating solar power, comprising:
one or more photovoltaic cell enclosures, wherein each enclosure of the one or more photovoltaic cell enclosures include:
an outer housing having a first opening disposed opposite a second opening and a first portion disposed opposite a second portion;
a first photovoltaic cell and a second photovoltaic cell located within the outer housing and positioned vertically such that the first photovoltaic cell and the second photovoltaic cell face one another,
wherein the first photovoltaic cell is located parallel to the first opening, and
wherein the second photovoltaic cell is located parallel to the second opening;
a first mirror located on an interior of the first portion of the outer housing; and
a second mirror located on an interior of the second portion of the outer housing,
wherein the first mirror and the second mirror are configured to reflect natural solar radiation onto a solar radiation collecting side of each of the first photovoltaic cell and the second photovoltaic cell to generate electricity, and
wherein the system for generating solar power comprises at least one of the following dimensions: a height of the outer housing is approximately 6.5 inches, a height of each mirror of the second set of mirrors is approximately 1.5 inches, and a width of each mirror of the second set of mirrors is approximately 3 inches.

10. The system of claim 9, wherein each of the one or more photovoltaic cell enclosures are stacked to decrease a square footage of the system.

11. The system of claim 10, further comprising:
one or more securement devices configured to secure the one or more photovoltaic cell enclosures.

* * * * *